United States Patent [19]
Von Raben et al.

[11] Patent Number: 4,806,193
[45] Date of Patent: Feb. 21, 1989

[54] APPARATUS FOR MEASURING BONDING PARAMETERS

[75] Inventors: Klaus U. Von Raben, Baldham; Rupert Ludwig, Alling, both of Fed. Rep. of Germany

[73] Assignee: Siemens Aktiengesellschaft, Berlin and Munich, Fed. Rep. of Germany

[21] Appl. No.: 148,955

[22] Filed: Jan. 27, 1988

[30] Foreign Application Priority Data

Feb. 9, 1987 [DE] Fed. Rep. of Germany ....... 3703943

[51] Int. Cl.$^4$ .............................................. B29C 65/08
[52] U.S. Cl. ..................................... 156/378; 73/582; 73/588; 228/104; 228/110
[58] Field of Search .................. 73/582, 588; 228/104, 228/110; 156/64, 378, 358

[56] References Cited

U.S. PATENT DOCUMENTS

| | | | |
|---|---|---|---|
| 3,827,619 | 8/1974 | Cusick et al. | 228/110 |
| 3,857,279 | 12/1974 | Salzer et al. | 73/588 |
| 4,004,456 | 1/1977 | Vahaviolos | 73/588 |
| 4,040,885 | 8/1977 | Hight et al. | 228/110 X |
| 4,373,653 | 2/1983 | Salzer et al. | 73/588 |
| 4,696,708 | 9/1987 | Keller et al. | 73/582 |

*Primary Examiner*—David Simmons
*Attorney, Agent, or Firm*—Hill, Van Santen, Steadman & Simpson

[57] ABSTRACT

In order to guarantee a constant quality of assembled modules, bonders in accordance with the object underlying the present invention must be monitored and potentially adjusted in suitable time intervals with respect to bonding force, ultrasound amplitude and bonding time. Further, it is an advantage that the present invention has a flexible format. In accordance with the invention, the registration of the measured values ensues with a mobile, piezo-electric sensor on a table of the bonder which is no higher than integrated circuits normally processed thereon. Fields of utilization cover all ultrasound bonders for integrated circuits.

11 Claims, 1 Drawing Sheet

APPARATUS FOR MEASURING BONDING PARAMETERS

BACKGROUND OF THE INVENTION

The present invention is directed to an apparatus for measuring and monitoring a force adjustment and an ultrasound adjustment in suitable time intervals for bonding machines, particularly bonders, which operate with ultrasound and preferably serve the purpose of bonding terminal wires which lead from semiconductor bodies to interconnects of non-conductive substrates.

Basically, bonding is a mechanical connecting process which also simultaneously produces an electrical contact of the parts to be joined. This is achieved in wire bonding in that two parts (for example a chip and a wire) which are initially not mechanically identical are connected to one another by modifying their surface structure. The modification is thereby produced on at least one part.

In the simplest case, this modification of the surface structure can ensue as a result of by the mere application of force. The force as well as temperature can then be reduced with additional use of ultrasound energy.

Extremely high demands are made of the quality of the connection in micro-electronics. The contacting of integrated circuits (IC) occurs with thin (about 17 through 50 $\mu$m) gold or aluminum wires. These wires are automatically applied to the IC and to the carrying frame by bonders.

The precision of the machines (contacting machines or bonders) must increase for smaller wires and integrated circuits. These machines automatically identify the pads on a chip and subsequently produce the wire bonds. In order to guarantee that the contacting machines maintain this precision during daily operation, it is necessary to be able to monitor certain elementary functions.

An optimized range of the bonding parameters (bonding force, ultrasound amplitude, bonding time and bonding temperature) which can guarantee the quality required for the component part is usually determined for each structural shape or form and contacting machine. This set of parameters, naturally, varies from structural form to structural form and likewise has variations with respect to the contact machines This optimized work range can be adhered to only with regular monitoring and potential follow-up adjustment of these contacting machines.

The object of the present invention is to design the apparatus initially defined to be able to measure the static and dynamic forces occurring when bonding, the ultrasound amplitude, and the bonding time during a single simulated bonding process in a force measurement of the bonders. Great value is thereby to be placed on a flexible format so that the force pick-up can be easily attached to different bonders.

In particular, individual phases or details such as, for example, transients or chronological sequences, should be investigated. Over and above this, individual bonders should be set to the parameters specified for them in the operating conditions and should be subsequently operated with these parameters.

German published application No. 32 33 629 shows and describes a method and an apparatus for producing connections with ultrasound. This involves a stationary apparatus with which the force is identified and monitored, that is the force which is required for parting the connecting tool from one of the component parts participating in the connection after the end of the connecting process. This, however, assumes an operation on the machine and an alteration of the machine which is either impossible in many machines or can be implemented only with relatively great outlay.

The apparatus disclosed by U.S. Pat. No. 3,857,279 likewise involves a measuring system stationarily integrated into the machine which measures and interprets harmonics of the ultrasound. A force measurement does not occur.

SUMMARY OF THE INVENTION

An object of the present invention is achieved in a measuring and monitoring apparatus for ICs which are only a few millimeters high, for example up to 3 mm.

The present invention discloses a method with which the adjustment of the bonding force and of the ultrasound amplitude of all ultrasound bonders can be measured and, thus, monitored. In comparison to traditional force measuring apparatus based on wire strain gauges, the present force pick-up which works on a piezo-electric base has the advantage of a path-free force measurement, of low space requirement and has the possibility of also measuring the ultrasound amplitude simultaneously with the force. This mobile sensor makes it possible to design a force pick-up which can be installed quickly and simply in standard bonders.

The sensor can be accommodated in a flat housing, for example a DIC housing (dual-in-line ceramic), and can be placed on the table of the bonder directly under the bonding nozzle in place of an IC to be bonded. Due to the small size and slight height of the sensor and of the housing, this can be done without restructuring the bonder.

The invention discloses a mobile and convenient instrument that is independent of the contacting machine and that enables routine monitoring and setting of the bonding parameters, bonding force, ultrasound amplitude and bonding time. The piezoelectric sensor registers these parameters which are subsequently processed as electrical quantities. These quantities can be immediately displayed and interpreted with the use of a storage oscilloscope.

BRIEF DESCRIPTION OF THE DRAWINGS

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which.

DESCRIPTION OF THE PREFERRED EMBODIMENTS

Figure 1:
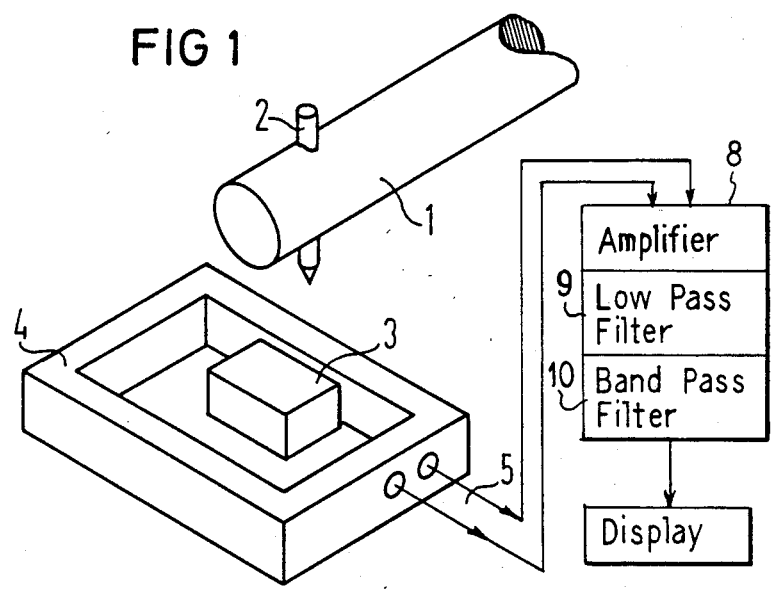
FIG. 1 is a perspective view of the apparatus for force and ultrasound measurement.

FIG. 1 schematically depicts a bonding arm 1 having a bonding tip 2. A piezo-electric sensor 3 in a housing 4 is situated directly under the bonding tip. The arrows 5 represent a connection to an amplifier 8.

With the heating turned off (table at room temperature), the sensor 3 replaces an IC to be bonded. The contacting machine executes the bonding process but without bonding (due to the lack of temperature; therefore a simulated bonding process is performed).

Figure 2:
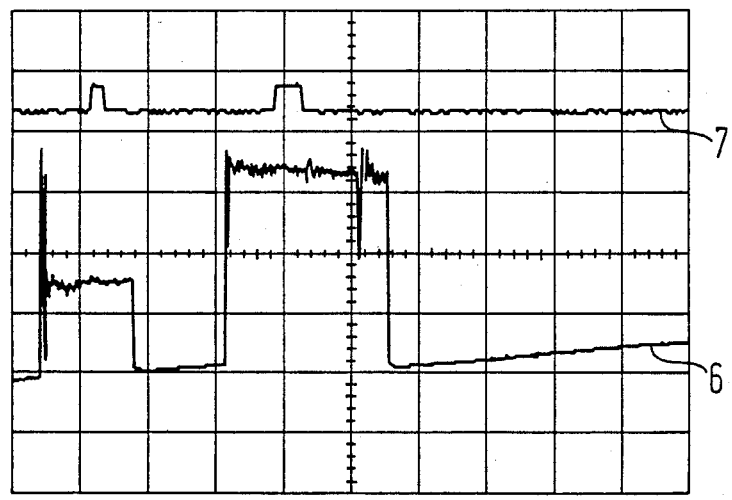
FIG. 2 is an oscillogram of the force and ultrasound signal.

The oscillogram of FIG. 2 shows a typical trace of the bonding force in curve 6 with which the bonding tip presses on the sensor and curve 7 shows a trace of the ultrasound amplitude. The time is entered on the abscissa, so that the pressing time of the bonding arm can be read from the signal length in curve 6 and the bonding time can be read from curve 7. The two bonding processes can be clearly recognized in the chronological curve of the force signal.

The first force pulse of the curve reflects the pressing of the "ball"; the second reflects that of the "wedge". As may be seen, the process of bonding is not a static process, i.e. the bonding arm does not constantly press on the IC or sensor with a constant force; on the contrary, a dynamic process occurs. Three regions of the force curve can be roughly distinguished during the bonding process:

(1) Placing the bonding arm onto the IC;
(2) The transient of the bonding arm; and
(3) The static region in which the bonding arm rests quietly on the IC and thus exerts a constant force (that is the bonding force).

Dependent on the adjustment of the contacting machines, on the manner in which the force is generated in the bonder (spring power, magneto-dynamic principle etc.), and on the chronological duration of the overall process, the individual regions of the force curve can differ in significance.

The signal output by the piezo-ceramic of the sensor 3 is preferably amplified in an operational amplifier 8. The sensitivity of the force measuring equipment can be modified via different integration capacitors in the amplifier and can be adapted to the respective force region. The amplified signal is divided into the portions shown in FIG. 2 with a low-pass filter 9 (for example, about 1KHz) and with a band-pass filter 10 (for example, about 60KHz). The signals can be displayed with a device 11, such as an oscilloscope.

The size of the bonding force, the transient behavior of the bonding arm, the ultrasound amplitude, the bonding time and the ultrasound signal can be taken from the line traces shown in FIG. 2 and can thus be separately measured and investigated. Further, the signals can be digitized after electronic processing and can be directly displayed as measured values. The bonding force and the ultrasound adjustment of the generator can thus be directly read as a digital value after the simulated bonding process. It is thereby possible to measure the bonding force and the ultrasound amplitude at the bonding tip of bonders working with ultrasound in one work step. Further, these parameters can be monitored and can be compared to the parameters of other bonders.

Although the invention has been described with respect to preferred embodiments, it is not to be so limited as changes and modifications can be made which are within the full intended scope of the invention as defined by the appended claims.

We claim as our invention:

1. An apparatus for measuring and monitoring force adjustment, ultrasound adjustment and bonding time of bonding machines, particularly bonders, which work with ultrasound and which are used for bonding terminal wires which lead from semiconductor bodies to interconnects of non-conductive substrates, comprising a mobile piezo-electric sensor independent of the bonding machine located on a table of the bonding machine under a tip of a bonding nozzle for measuring the bonding force and ultrasound amplitude, said piezo-electric sensor providing a bonding force signal, an ultrasound signal for a bonding time and registering them during a simulated bonding process; and these two signals being supplied to an amplifier which electronically separates these two signals with filters and supplies them to an apparatus for display and evaluation.

2. The apparatus according to claim 1, wherein the piezo-electric sensor has a housing which is not higher than integrated circuits usually processed by the bonding machine.

3. The apparatus according to claim 1, wherein the amplifier is a high-impedance amplifier; and two filters are connected to the amplifier; the two filters being a low-pass filter (about 1kHz) for the bonding force signal and a pass-band filter (about 60 kHz) for the ultrasound signal.

4. The apparatus according to claim 1, wherein the apparatus for display and evaluation is a storage oscilloscope connected to a printer or plotter for interpretation.

5. The apparatus according to claim 1, wherein the apparatus for display and evaluation is an electronic display which digitally indicates the bonding force, the ultrasound amplitude and the bonding time of the bonding process.

6. An apparatus for measuring and monitoring the parameters of bonding force and ultrasound amplitude for a bonding machine over a bonding time during a simulated bonding process, comprising:
a mobile piezo-electric sensor located on a table of the bonding machine and under a tip of a bonding nozzle of the bonding machine, said tip contacting said sensor during the bonding process, said sensor providing an output signal indicative of the bonding force and the ultrasound amplitude during the bonding process.

7. The apparatus according to claim 6, wherein the apparatus further comprises:
means for amplifying said output signal;
means for separating said amplified output signal into a bonding force signal and an ultrasound signal; and
means for evaluating said bonding force signal and said ultrasound signal.

8. The apparatus according to claim 7, wherein said means for separating is a low pass filter of about 1 KHz to provide said bonding force signal and a band-pass filter of about 60 kHz to provide said ultrasound signal.

9. The apparatus according to claim 7, wherein said means for evaluating is a storage oscilloscope.

10. The apparatus according to claim 7, wherein said means for evaluating is an electronic display which digitally indicates the bonding force, the ultrasound amplitude and the bonding time of the bonding process.

11. The apparatus according to claim 6, wherein said piezo-electric sensor is contained in a housing, said sensor and said housing having a height not greater than integrated circuits used in the bonding machine.

* * * * *